US010938362B2

(12) United States Patent
Naghed

(10) Patent No.: US 10,938,362 B2
(45) Date of Patent: Mar. 2, 2021

(54) OFFSET CANCELLATION

(71) Applicant: Renesas Electronics Corporation, Tokyo (JP)

(72) Inventor: Mohsen Naghed, Duesseldorf (DE)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/635,092

(22) PCT Filed: Jul. 31, 2017

(86) PCT No.: PCT/EP2017/069333
§ 371 (c)(1),
(2) Date: Jan. 29, 2020

(87) PCT Pub. No.: WO2019/024976
PCT Pub. Date: Feb. 7, 2019

(65) Prior Publication Data
US 2020/0280291 A1 Sep. 3, 2020

(51) Int. Cl.
*H03F 3/45* (2006.01)
*H04B 1/10* (2006.01)

(52) U.S. Cl.
CPC ..... *H03F 3/45995* (2013.01); *H03F 3/45475* (2013.01); *H04B 1/10* (2013.01);
(Continued)

(58) Field of Classification Search
CPC .... H03F 3/45995; H03F 3/45475; H04B 1/10
(Continued)

(56) References Cited

U.S. PATENT DOCUMENTS 4,841,252 A 6/1989 Lou
5,648,738 A 7/1997 Welland et al.
(Continued)

OTHER PUBLICATIONS

International Search Report, dated Mar. 12, 2018, pp. 1-4.

*Primary Examiner* — Tomi Skibinski
(74) *Attorney, Agent, or Firm* — McDermott Will & Emery LLP

(57) ABSTRACT

Apparatus for performing offset cancellation is disclosed. The apparatus comprises a gating circuit (6) for receiving an analogue signal (3) from a source (2) and providing a gated analogue signal (9) to an analogue circuit (10), a gating controller (7; 14; FIG. 1) and a digital processor (14; FIG. 1) for receiving a digital signal (13) converted from an analogue output (11) from the analogue circuit (10). The gating circuit comprises at least one path ($21_1$), each path respectively comprising, an input terminal ($22_1$), an output terminal ($23_1$), a node ($24_1$) interposed between the input and output terminals, a first transistor (Q1) having a channel arranged between the input terminal and the node, and a second transistor (Q3) having channel arranged between the node and a fixed reference, such as ground (GND). The gating controller is configured, in a first time window ($15_A$), to switch the first transistor so that the input terminal and the output terminal are decoupled and to switch the second transistor so that the node is coupled to the fixed reference. The gating controller is configured, in a second, different time window ($15_B$), to switch the second transistor so that the node and the fixed reference are decoupled and to switch the first transistor so that the input terminal is coupled to the input terminal. The digital processor is configured, in the first time window, to take a first measurement of the digital signal, and, in the second, different time window, to take a second measurement of the digital signal. The digital pro-
(Continued)

cessor configured to subtract the first measurement from the second measurement.

16 Claims, 5 Drawing Sheets

(52) U.S. Cl.
CPC .............. *H03F 2203/45138* (2013.01); *H03F 2203/45212* (2013.01)

(58) Field of Classification Search
USPC .......................................................... 327/307
See application file for complete search history.

(56) References Cited

U.S. PATENT DOCUMENTS 5,721,547 A * 2/1998 Longo .................. H03M 3/356 341/118
5,812,023 A 9/1998 Jones
6,141,169 A 10/2000 Pietruszynski et al.
8,258,864 B1 9/2012 Chan et al.
2002/0017573 A1 2/2002 Sturman
2004/0137853 A1 7/2004 Tanaka et al.
2004/0266381 A1 12/2004 Shafeeu
2007/0139242 A1 6/2007 Krymski
2007/0188219 A1 8/2007 Segarra
2009/0206854 A1* 8/2009 Bernardon ............. G01R 27/14 324/713
2009/0261881 A1 10/2009 Iraha et al.
2012/0196555 A1 8/2012 Igarashi et al.
2012/0200351 A1 8/2012 Takahashi et al.
2013/0184794 A1* 7/2013 Feldman .............. A61N 1/0534 607/116
2014/0266379 A1* 9/2014 Inoue ..................... H03K 5/249 327/307
2015/0311913 A1* 10/2015 Pan ......................... H03M 1/38 341/156

* cited by examiner

OFFSET CANCELLATION

CROSS-REFERENCE TO RELATED APPLICATIONS

The present application is a 371 U.S. national phase application of PCT/EP2017/069333 filed Jul. 31, 2017, the contents of which are incorporated herein by reference in their entirety.

FIELD OF THE INVENTION

The present invention relates to offset cancellation.

BACKGROUND

Non-zero offset cancellation non-zero offset correction (which may be referred to simply as "offset correction", and which may be also called "offset cancellation", "offset compensation" or "self-calibration"), may be used in a wide variety of applications.

Examples of offset cancellation circuits can be found in US 2012/196555 A1, U.S. Pat. No. 8,258,864 B, US 2012/200351 A1, US 2004/137853 A1, US 2009/261881 A1, US 2007/188219 A1, US 2007/139242 A1, US 2004/266381 A1, US 2002/175731A1, U.S. Pat. Nos. 5,812,023 A, 6,141,169 A, 4,841,252 A1, and 5,648,738 A.

Richard Palmer: "DC Parameters: Input Offset Voltage ($V_{IO}$)", Texas Instruments® Application report SLOA059 (2001) shows (in FIG. 14) an autocalibration circuit for adjusting for removing input offset voltage. A CMOS op amp digitally trims input offset voltage using an ADC, a successive approximation register (SAR) and a DAC. During start-up, two switches A which couple two inputs to the respective inputs of op amp are open, a switch B which couples the inputs of the op amp are closed, thereby shorting the inputs of the op amp, and connecting the output to the ADC. The input offset voltage of the amplifier appears at the output and is converted to a digital signal, then stored on the SAR. The DAC output current is fed into the null line of the op amp, reducing the input offset voltage.

SUMMARY

According to a first aspect of the present invention there is provided apparatus for performing offset cancellation. The apparatus comprises a gating circuit for receiving an analogue signal from a source and providing a gated analogue signal to an analogue circuit (such as a gain amplifier), a gating controller, and a digital processor for receiving a digital signal converted from an analogue output from the analogue circuit. The gating circuit comprises at least one path, each path respectively comprising, an input terminal, an output terminal, a node interposed between the input and output terminals, a first transistor having a channel arranged between the input terminal and the node, and a second transistor having channel arranged between the node and a fixed reference, such as ground. The gating controller is configured, in a first time window, to switch the first transistor so that the input terminal and the output terminal are decoupled and to switch the second transistor so that the node is coupled to the fixed reference. The gating controller is configured, in a second, different time window, to switch the second transistor so that the node and the fixed reference are decoupled and to switch the first transistor so that the input terminal is coupled to the input terminal. The digital processor is configured, in the first time window, to take a first measurement of the digital signal, and, in the second, different time window, to take a second measurement of the digital signal. The digital processor configured to subtract the first measurement from the second measurement.

Rather than using an approach employing feedback, this can provide more accurate offset cancellation and, moreover, can be easier to incorporate into existing analogue circuit systems.

The gating circuit may comprise two paths including first and second paths. Thus, the gating circuit may be configured to receive a differential input and output a differential output. The fixed reference may be ground.

According to a second aspect of the present invention there is provided apparatus for performing offset cancellation. The apparatus comprises a gating circuit for receiving an analogue signal from a source and providing a gated analogue signal to an analogue circuit, a gating controller, and a digital processor for receiving a digital signal converted from an analogue output from the analogue circuit. The gating circuit comprises first and second paths, each path respectively comprising an input terminal, an output terminal, a node interposed between the input and output terminals and a first transistor having a channel arranged between the input terminal and the node. The gating circuit further comprises a second transistor having channel arranged between the nodes in the first and second paths. The gating controller is configured, in a first time window, to switch the first transistor so that the input terminal and the output terminal are decoupled and to switch the second transistor so that the nodes are coupled, and, in a second, different time window, to switch the second transistor so that the nodes are decoupled and to switch the first transistor so that the input terminal is coupled to the input terminal. The digital processor is configured, in the first time window, to take a first measurement of the digital signal, and, in the second, different time window, to take a second measurement of the digital signal, the digital processor configured to subtract the first measurement from the second measurement.

The analogue circuit may be a gain amplifier. The gain amplifier may be a programmable gain amplifier.

The transistors may take the form of MOSFETs. The MOSFETs may include n-channel and/or p-channel MOSFETS. The MOSFETs may be enhancement-mode MOSFETs.

The digital processor may be a digital signal processor. The digital processor may be provided by a microcontroller or system-on-a-chip.

According to a third aspect of the present invention there is system comprising the apparatus according to the first aspect or the second aspect of the present invention, an analogue circuit having at least one input terminal and at least one output terminal, and an analogue-to-digital converter section. The output terminal(s) of the output circuit are connected to the input terminal(s) of the analogue circuit so as to provide the gated analogue signal, the output terminal(s) of the analogue circuit are connected to the analogue-to-digital converter section, and the analogue-to-digital converter section is arranged to provide the digital signal to the digital processor.

The system may further comprise a signal source coupled to the gating circuit. The signal source may be a battery.

According to a fourth aspect of the present invention there is provided a vehicle or plant comprising the system according to the third aspect.

The vehicle or plant may be a motor vehicle. The motor vehicle may be a motorcycle, an automobile (sometimes referred to as a "car"), a minibus, a bus, a truck or lorry. The motor vehicle may be powered by an internal combustion engine and/or one or more electric motors.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
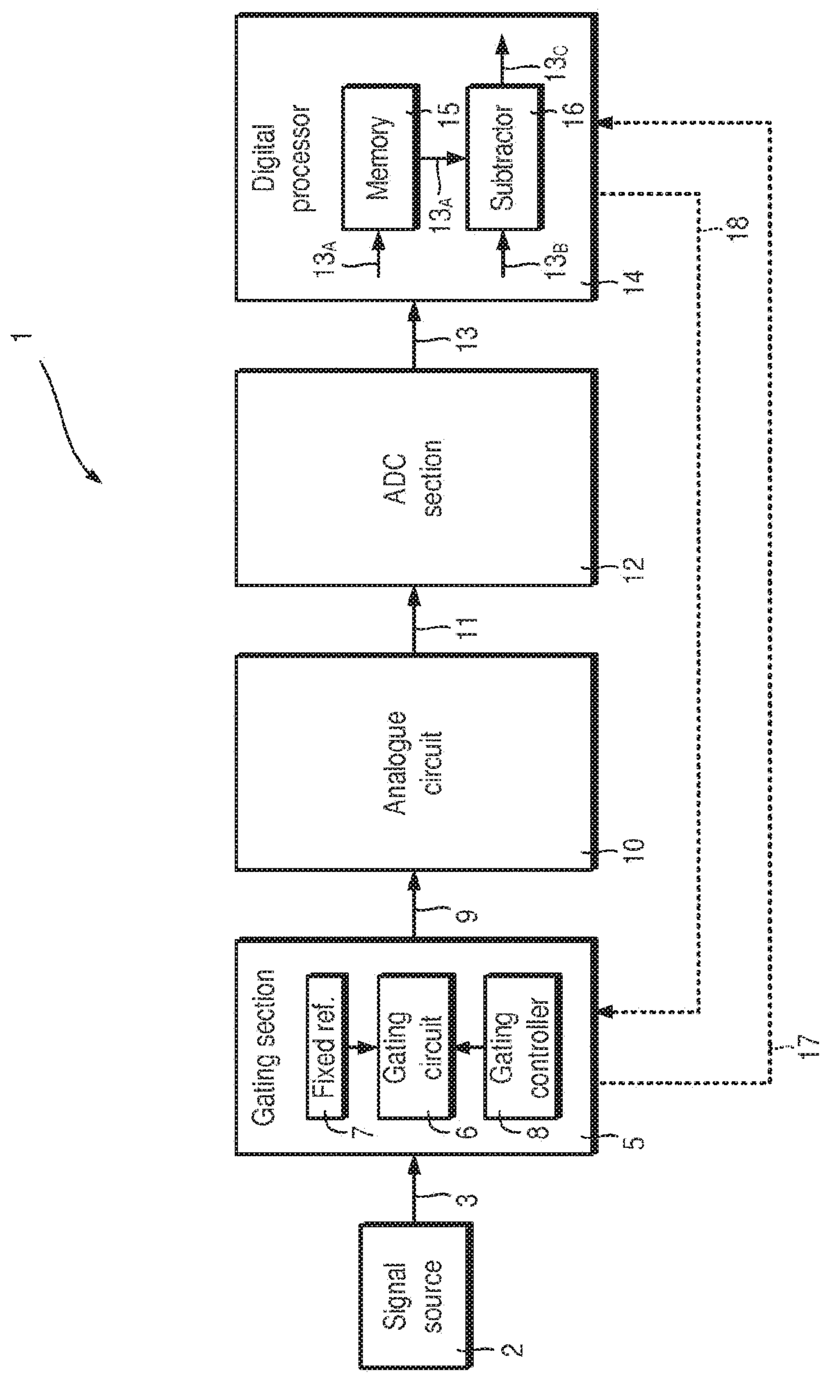
FIG. 1 is a schematic block diagram of a measurement system which includes auto offset cancellation.

Referring to FIG. 1, a measurement system 1 and a signal source 2 is shown.

The measurement system 1 samples an analogue input signal 3 (which may be single-ended or differential) from the source 2, such as a battery. The measurement system 1 is able to perform non-zero offset correction. A non-zero offset arises when a nominally zero input signal results in a non-zero output signal.

The measurement system 1 includes a gating device 5 (herein referred to as a "gating section" or "gating module") which includes a gating circuit 6 provided with a fixed reference 7, such as ground, and a gating controller 8. The gating device 5 receives the analogue signal 3 from the source 2 and provides a gated analogue signal 9 to an analogue circuit 10. The analogue circuit 10 may be for example, an amplifier, such as a fixed or programmable gain amplifier, or a comparator, and may include one, two or more stages. The analogue circuit 10 provides an output analogue signal 11 to an analogue-to-digital section 12 which digitises the signal 11 and which, optionally, may carry out analogue or digital filtering. The analogue-to-digital section 11 outputs a digital signal 13 to a digital processor 14. The digital processor 14 may take the form of a digital signal processor (DSP) or other suitable form of digital processor, such as a microcontroller, system-on-a chip, or field-programmable gate array.

As will be explained in more detail later, the digital processor 14 can measure the digital signal 13 at different times and process values taken at different times. A first measurement 13A is made in a first time window $\mathbf{15}_A$ (FIG. 3) during which the input signal 3 is decoupled from the analogue circuit 10 and provided instead a nominally zero input signal. A second measurement 13B is made in a second time window $\mathbf{15}_B$(FIG. 3) during which the input signal 3 is coupled to the analogue circuit 10.

The digital processor 14 includes memory 15 for storing the first measurement $\mathbf{13}_A$, i.e. a digital value of a measured non-zero offset value (herein referred to as the "measured offset signal"), and a subtraction module 16 which subtracts the measured offset signal $\mathbf{13}_A$ from the second measurement 13B (herein referred to as the "measured input signal") to provide a third signal $\mathbf{13}_C$, i.e. a compensated measured signal. Single values may be used, e.g. by taking an instantaneous value or averaging several values.

Figure 3:
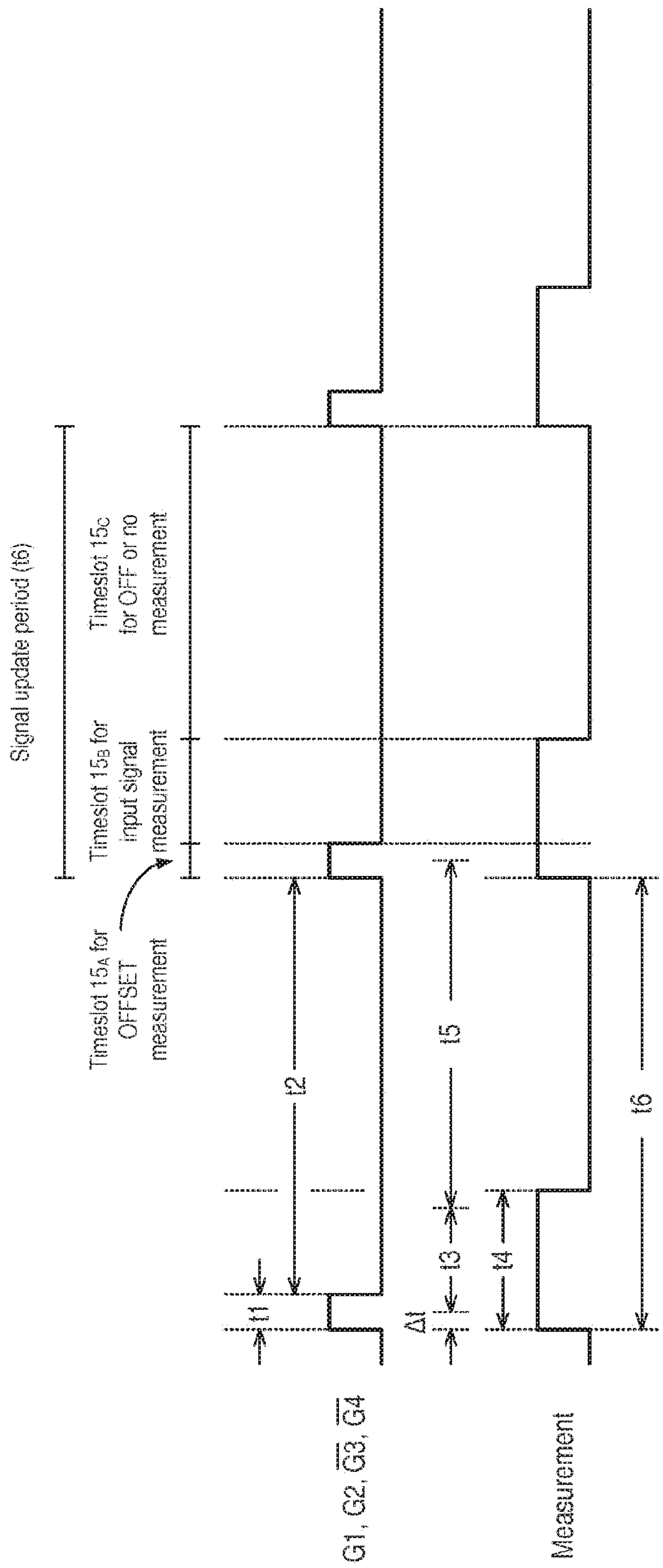
FIG. 3 is a timing diagram for auto offset cancellation.

The gating section 5 may provide a timing signal 17, e.g. a copy of a transistor enable signal, to the digital processor 17 to enable the digital processor 14 to identify the end of the first time window $\mathbf{15}_A$ (FIG. 3) and, thus, the start of the second time window $\mathbf{15}_B$(FIG. 3). Conversely, the digital processor 14 may provide control signal(s) 18 to the gating section 5 to control operation of the gating circuit 5. Thus, the gating controller 8 may be provided by the digital processor 14 and a gating controller in the gating section 5 need not be provided.

Figure 2:
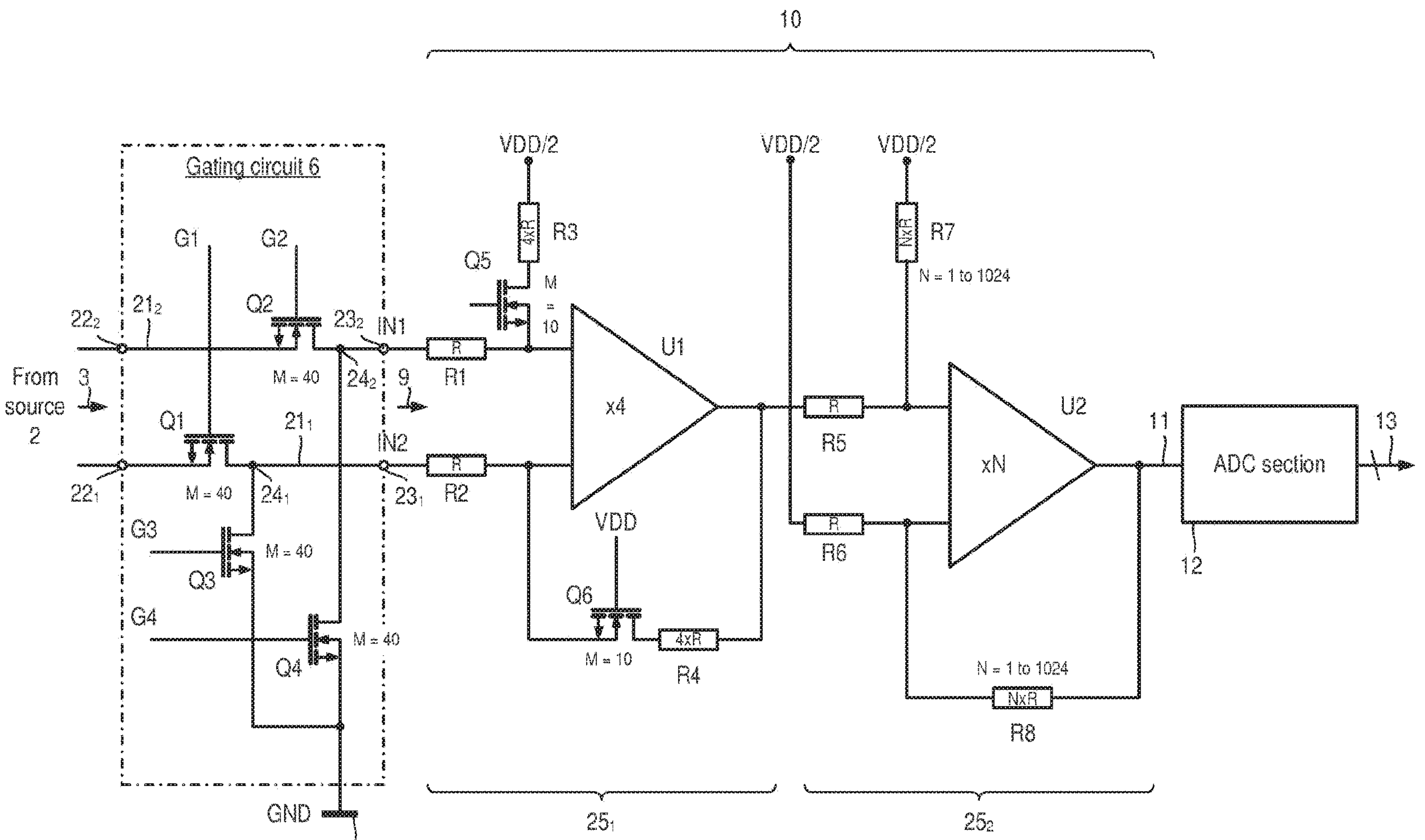
FIG. 2 is a schematic circuit diagram of a switching circuit and switching circuit controller, an analogue circuit, and an analogue-to-digital converter section.

Referring to FIG. 2, the gating circuit 6 and the analogue circuit 10 in the form of a two-stage, programmable gain amplifier, are shown.

The gating circuit 6 includes first and second paths $\mathbf{21}_1$, $\mathbf{21}_2$ each having a respective input terminal $\mathbf{22}_1$, $\mathbf{22}_2$, a respective output terminal $\mathbf{23}_1$, $\mathbf{23}_2$ and a respective intermediate node $\mathbf{24}_1$, $\mathbf{24}_2$ lying on the path $\mathbf{21}_1$, $\mathbf{21}_2$ between the input terminal $\mathbf{22}_1$, $\mathbf{22}_2$ and output terminal $\mathbf{23}_1$, $\mathbf{23}_2$.

Each path $\mathbf{21}_1$, $\mathbf{21}_2$ includes a respective first transistor Q1, Q2 in the form of an n-channel, enhancement-type MOSFET in which the channel forms part of the path $\mathbf{21}_1$, $\mathbf{21}_2$. The first transistor Q1, Q2 is used to selectively couple and decouple the input terminal $\mathbf{22}_1$, $\mathbf{22}_2$ to the output terminal $\mathbf{23}_1$, $\mathbf{23}_2$.

A respective second transistor Q3, Q4 in the form of an n-channel, enhancement-type MOSFET is connected between the intermediate node $\mathbf{24}_1$, $\mathbf{24}_2$ and the fixed reference 7, in this case ground. Each second transistor Q3, Q4 is used to selectively couple and decouple to the output terminal $\mathbf{23}_1$, $\mathbf{23}_2$ to the fixed reference.

Gates G1, G2, G3, G4 of the transistors Q1, Q2, Q3, Q4 are controlled by the controller 8. The first transistors Q1, Q2 are controlled as a set, that is, have same state ON or OFF, and are switched at the same time. Likewise, the second transistors Q3, Q4 are controlled as a set. However, operating of the first transistors Q1, Q2 and second transistors Q3, Q4 are complementary, that is, when the first transistors Q1, Q2 are ON, the second transistors Q3, Q4 are OFF and vice versa.

The output terminals $\mathbf{22}_1$, $\mathbf{22}_2$ are coupled to the inputs of a first operation amplifier U1 via first and second resistors R1, R2 of the first stage $\mathbf{25}_1$ of the programmable gain amplifier.

The first stage $\mathbf{25}_1$ of the programmable gain amplifier includes the first operational amplifier U1, fifth and sixth transistors Q5, Q6 and third and fourth resistors R3, R4. The first input of the first operational amplifier U1 is connected to half the supply voltage 0.5 VDD via the fifth transistor Q5 and the third resistor R3. The second input of the operational amplifier U1 is connected to the output of the operational amplifier U1 via the sixth transistor Q6 and the fourth resistor R4. In this case, R1=R2=R and R3=R4=4·R.

The output of the operational amplifier U1 and the supply voltage 0.5 VDD are coupled to the inputs of a second operation amplifier U2 via fifth and sixth R5, R6 of the second stage $\mathbf{25}_2$ of the programmable gain amplifier.

The second stage $\mathbf{25}_2$ of the programmable gain amplifier includes seventh and eighth resistors R7, R8. The first input of the second operational amplifier U1 is connected to half the supply voltage 0.5 VDD via the seventh resistor R7. The second input of the operational amplifier U2 is connected to the output of the operational amplifier U2 via the eight resistor R8. The resistance values of the seventh and eighth resistors R7, R8 can be programmed and can take a value N·R where N is a positive, non-zero integer which lies in the range from 1 to 1024.

The output of the operational amplifier U2 is supplied to the ADC section 12.

FIG. 2 shows an arrangement employing differential input. However, offset correction circuit employing a single path may be used for a single-ended input.

Figure 4:
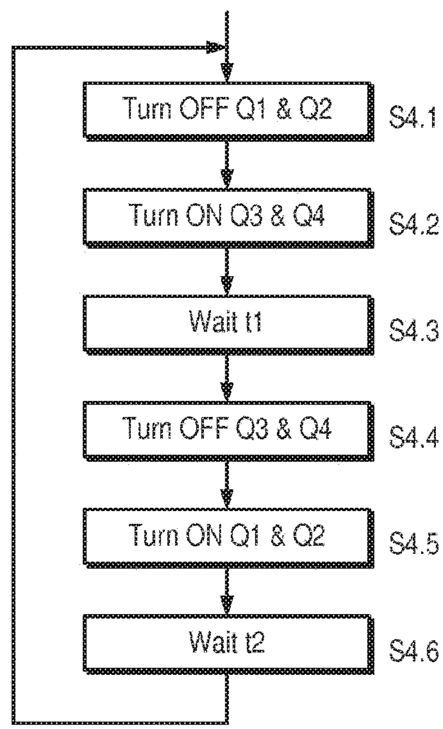
FIG. 4 is a flow diagram of a method performed by a switching circuit controller.
Figure 5:
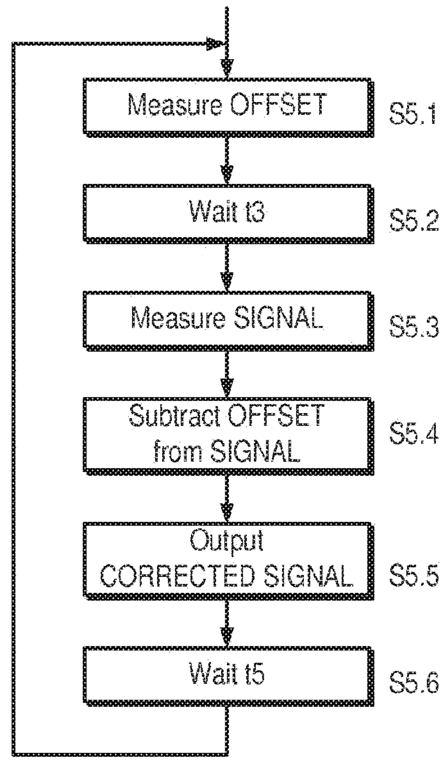
FIG. 5 is a flow diagram of a method performed by a digital processor.

Referring also to FIGS. 3, 4, and 5, operation of the measurement system 1, in particular the gating section 5 and the digital processor 14, to perform offset cancellation will now be described.

The measurement system 1 may become active, for example, by power being applied by the gating section 5 and/or the digital processor 14 waking from a dormant state.

The gating controller 8 (or if gating control is provided by the digital processor 14, the digital processor 14), turns OFF the first transistors Q1, Q2 and turns ON the second transistors Q3, Q4 (steps S4.1 & S4.2). Turning OFF the first transistors Q1, Q2 and turning ON the second transistors Q3, Q4 may occur at the same time. Alternatively, the first transistors Q1, Q2 may be switched OFF before the second transistors Q3, Q4 are switched ON. The gating controller 8 (or the digital processor 14) then waits for a time t1 which defines a first time window $15_A$ (step S4.3).

During this time window $15_A$, the digital processor 14 measures and stores a measured offset signal $13_A$ (step S5.1). The measurement takes place after a delay Δt after the start of the first time window $15_A$, Δt<<t1, where t1 is the duration of the first time window $15_A$. The digital processor 14 then waits a period t3<<(t4−Δt) until the second time window $15_B$ (step S5.2).

The gating controller 8 (or digital processor 14), turns OFF the second transistors Q3, Q4 and turns ON the first transistors Q1, Q2 (steps S4.4 & S4.5) and then waits time t2 (step S4.6).

During the second time window $15_B$, the digital processor 14 measures the input signal $13_B$ (step S5.3), subtracts the measured offset signal $13_A$ from the input signal $13_B$ (step S5.4) and outputs (e.g. stores) the corrected signal $13_C$ (step S5.5). The digital processor 14 then waits a period t5 (step S5.6) until Δt after the start of the next period.

Performing offset cancellation in digital domain can help to provide much greater sensitivity, not just in the range of milli- or micro-volts, but of the order of nano-volts.

For example, for a battery and/or other applications, an offset voltage error after cancellation may be of the order 100 nV for a voltage measurement range of +/−75 mV.

Thus, a voltage resolution of 250 nV may be needed thus requiring an ADC resolution of 22 bits. For a smaller ratio of offset voltage to measurement range or measurement resolution, a greater ADC resolution may be needed. Conversely, for a larger ratio of offset voltage to measurement range or measurement resolution, a smaller ADC resolution may be needed.

Alternative Gating Circuit 6'

Figure 6:
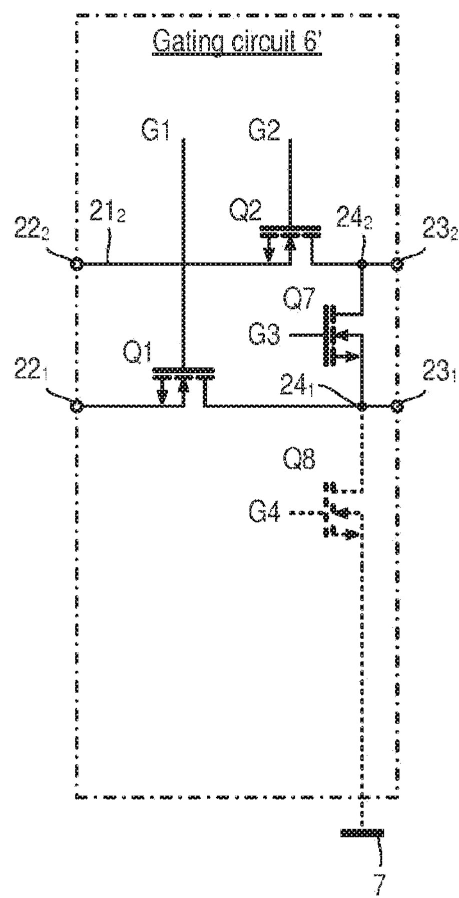
FIG. 6 is a schematic circuit diagram of an alternative switching circuit.

FIG. 6 shows an alternative gating circuit 6' which can be used instead of the gating circuit 6 shown in FIG. 2.

Referring to FIGS. 2 and 6, the alternative gating circuit 6' is the same as the gating circuit 6 shown in FIG. 2, except that instead of two second transistors Q3, Q4, a single transistor Q7 is used, arranged so that it selectively couples and decouples the nodes $24_1$, $24_2$. Thus, fewer transistors can be used.

In this arrangement, however, the outputs $23_1$, $23_2$ may float which can lead to an error at the amplifier output due to common mode shift of the amplifier inputs. Thus, in cases where accurate offset cancellation is required, an additional transistor Q8 may be used to couple the nodes $24_1$, $24_2$ to a fixed reference, for example ground.

Modifications

It will be appreciated that various modifications may be made to the embodiments hereinbefore described. Such modifications may involve equivalent and other features which are already known in the design, manufacture and use of amplifier circuits, analogue-to-digital converters and digital processors and component parts thereof and which may be used instead of or in addition to features already described herein. Features of one embodiment may be replaced or supplemented by features of another embodiment.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. Apparatus for performing offset cancellation, the apparatus comprising:
- a gating circuit for receiving an analogue signal from a source and providing a gated analogue signal to an analogue circuit;
- a gating controller; and
- a digital processor for receiving a digital signal converted from an analogue output from the analogue circuit;
- wherein the gating circuit comprises:
  - first and second paths, each path respectively comprising:
    - an input terminal;
    - an output terminal;
    - a node interposed between the input and output terminals;
    - a first transistor having a channel arranged between the input terminal and the node; and
    - a second transistor having a channel arranged between the node and a fixed reference;
- wherein the gating controller configured:
  - in a first time window:
  - to switch the first transistor so that the input terminal and the output terminal are decoupled and to switch the second transistor so that the node is coupled to the fixed reference; and
  - in a second, different time window:
  - to switch the second transistor so that the node and the fixed reference are decoupled and to switch the first transistor so that the input terminal is coupled to the output terminal;
- wherein the digital processor is configured:
  - in the first time window:
  - to take a first measurement of the digital signal; and
  - in the second, different time window:
  - to take a second measurement of the digital signal;
- the digital processor configured to subtract the first measurement from the second measurement.

2. The apparatus of claim 1, wherein the fixed reference is ground.

3. The apparatus of claim 1, wherein the analogue circuit (10) is a gain amplifier.

4. The apparatus of claim 3, wherein the gain amplifier is a programmable gain amplifier.

5. The apparatus of claim 1, wherein the digital processor (15) is a digital signal processor.

6. A system comprising:

the apparatus according to claim 1;

an analogue circuit having at least one input terminal and at least one output terminal; and an analogue-to-digital converter section;

wherein the output terminal(s) of the output circuit are connected to the input terminal(s) of the analogue circuit so as to provide the gated analogue signal, the output terminal(s) of the analogue circuit are connected to the analogue-to-digital converter section, and the analogue-to-digital converter section is arranged to provide the digital signal to the digital processor.

7. A system of claim 6, further comprising:

a signal source coupled to the gating circuit.

8. A system of claim 7, wherein the signal source is battery.

9. The apparatus of claim 1, wherein the fixed reference is ground.

10. Apparatus for performing offset cancellation, the apparatus comprising:

a gating circuit for receiving an analogue signal from a source and providing a gated analogue signal to an analogue circuit;

a gating controller; and a digital processor for receiving a digital signal converted from an analogue output from the analogue circuit;

wherein the gating circuit comprises:

first and second paths, each path respectively comprising:

an input terminal;

an output terminal;

a node interposed between the input and output terminals; and a first transistor having a channel arranged between the input terminal and the node;

wherein the gating circuit further comprises:

a second transistor having a channel arranged between the nodes in the first and second paths;

wherein the gating controller configured:

in a first time window:

to switch the first transistor so that the input terminal and the output terminal are decoupled and to switch the second transistor so that the nodes are coupled, and in a second, different time window:

to switch the second transistor so that the nodes are decoupled and to switch the first transistor so that the input terminal is coupled to the output terminal, wherein the digital processor configured:

in the first time window:

to take a first measurement of the digital signal; and in the second, different time window:

to take a second measurement of the digital signal;

the digital processor configured to subtract the first measurement from the second measurement.

11. The apparatus of claim 10, wherein the analogue circuit is a gain amplifier.

12. The apparatus of claim 11, wherein the gain amplifier is a programmable gain amplifier.

13. The apparatus of claim 10, wherein the digital processor is a digital signal processor.

14. A system comprising:

the apparatus according to claim 10;

an analogue circuit having at least one input terminal and at least one output terminal; and an analogue-to-digital converter section;

wherein the output terminal(s) of the output circuit are connected to the input terminal(s) of the analogue circuit so as to provide the gated analogue signal, the output terminal(s) of the analogue circuit are connected to the analogue-to-digital converter section, and the analogue-to-digital converter section is arranged to provide the digital signal to the digital processor.

15. A system of claim 14, further comprising:

a signal source coupled to the gating circuit.

16. A system of claim 15, wherein the signal source is battery.

* * * * *